(12) United States Patent
Tajima et al.

(10) Patent No.: US 8,786,162 B2
(45) Date of Patent: Jul. 22, 2014

(54) DEVICE FOR DRIVING A PIEZOELECTRIC ELEMENT

(75) Inventors: Shingo Tajima, Itami (JP); Shoji Tsuchioka, Itami (JP); Takehiko Umeyama, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 205 days.

(21) Appl. No.: 13/398,838

(22) Filed: Feb. 17, 2012

(65) Prior Publication Data

US 2012/0212099 A1 Aug. 23, 2012

(30) Foreign Application Priority Data

Feb. 21, 2011 (JP) ................................. 2011-034656

(51) Int. Cl.
*H02N 2/06* (2006.01)
(52) U.S. Cl.
USPC ...................................... 310/316.03; 310/317
(58) Field of Classification Search
USPC ............................................ 310/316.03, 317
See application file for complete search history.

(56) References Cited

U.S. PATENT DOCUMENTS

| 6,198,198 | B1* | 3/2001 | Fujimura et al. | 310/316.01 |
| 6,876,135 | B2* | 4/2005 | Pelrine et al. | 310/339 |
| 2010/0007704 | A1* | 1/2010 | Nitta | 347/68 |
| 2010/0296184 | A1* | 11/2010 | Shibatani | 359/824 |

FOREIGN PATENT DOCUMENTS

WO    WO 2009/014148 A1    1/2009

* cited by examiner

*Primary Examiner* — Derek Rosenau
(74) *Attorney, Agent, or Firm* — Miles & Stockbridge P.C.

(57) ABSTRACT

The disclosed invention provides a device for driving a piezoelectric element, making it possible to make an output voltage follow a control voltage during a discharging action. A charging circuit charges a piezo element through a first node. A discharging circuit discharges electric charge charged in the piezo element through the first node. A control circuit makes switching to cause the discharging circuit to perform a discharging action or cause the charging circuit to perform a charging action, based on a comparison between the magnitude of a voltage being applied to the piezo element and the magnitude of a control voltage.

6 Claims, 12 Drawing Sheets

US 8,786,162 B2

DEVICE FOR DRIVING A PIEZOELECTRIC ELEMENT

CROSS-REFERENCE TO RELATED APPLICATIONS

The disclosure of Japanese Patent Application No. 2011-34656 filed on Feb. 21, 2011 including the specification, drawings and abstract is incorporated herein by reference in its entirety.

BACKGROUND

The present invention relates to a device for driving a piezoelectric element.

Devices for driving a piezoelectric element such as a piezo element have heretofore been disclosed. For example, in Patent Document 1 (a pamphlet of Published PCT International Application No. 2009/014148), there is disclosed a piezoelectric element driving device that draws in and spews out a liquid by expansion and contraction of a piezoelectric element when it is charged and discharged. This piezoelectric element driving device includes a voltage up means that increases a power supply voltage and applies the increased voltage to the piezoelectric element and a discharging means that discharges a voltage charged in the piezoelectric element.

RELATED ART DOCUMENT

Patent Document

[Patent Document 1] A pamphlet of Published PCT International Application No. 2009/014148

SUMMARY

However, the piezoelectric element driving device described in Patent Document 1 has a problem that the device is unable to make an output voltage follow a control voltage during a discharging action.

Therefore, an object of the present invention is to provide a device for driving a piezoelectric element, making it possible to make an output voltage follow a control voltage during a discharging action.

In one embodiment of the present invention, a device for driving a piezoelectric element includes a charging circuit that charges the piezoelectric element through a first node, a discharging circuit that discharges electric charge charged in the piezoelectric element through the first node, and a control circuit that makes switching to cause the discharging circuit to perform a discharging action or cause the charging circuit to perform a charging action, based on a comparison between the magnitude of a voltage being applied to the piezoelectric element and the magnitude of a control voltage.

According to one embodiment of the present invention, it is possible to make an output voltage follow a control voltage during a discharging action.

DETAILED DESCRIPTION

In the following, embodiments of the present invention will be described with reference to the drawings.

First Embodiment

Figure 1:
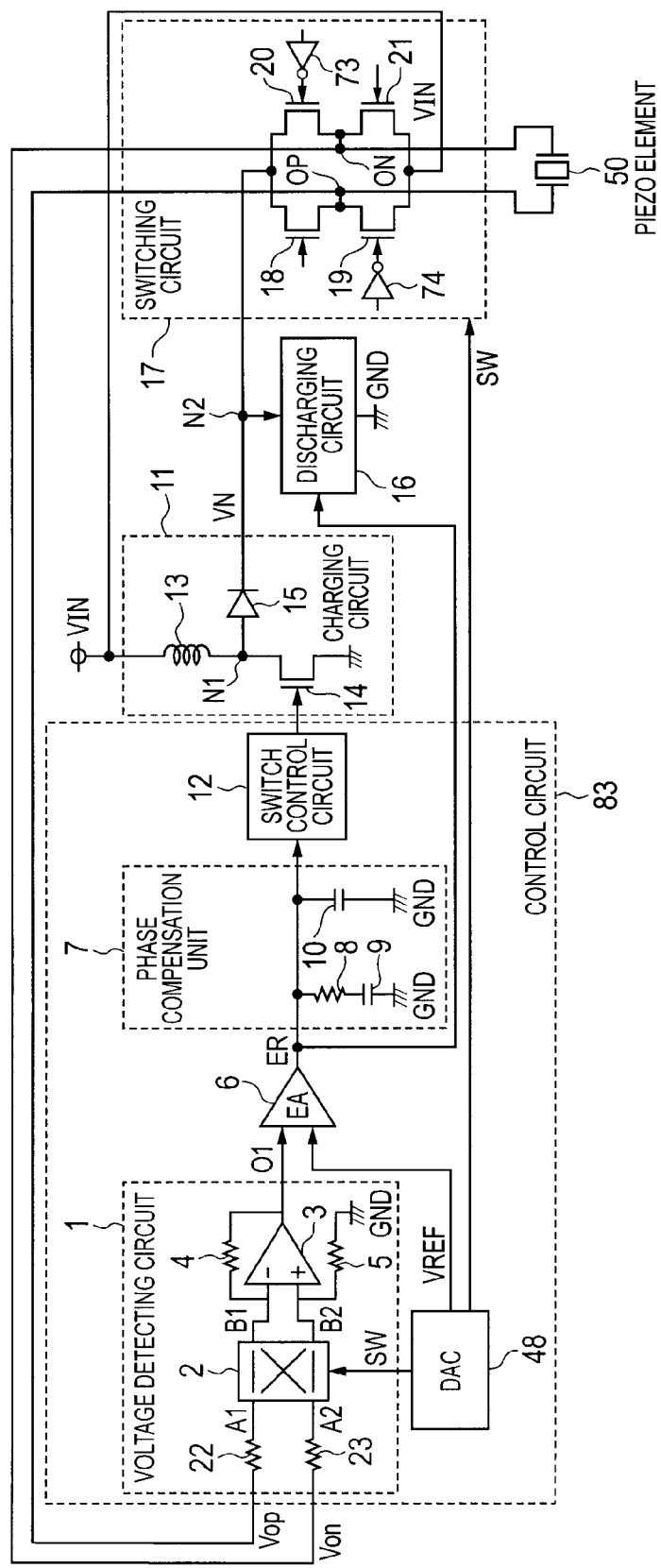
FIG. 1 is a diagram depicting a configuration of a piezo element driving device.

FIG. 1 is a diagram depicting a configuration of a piezo element driving device.

Referring to FIG. 1, this piezo element driving device has a control circuit 83, a charging circuit 11, a discharging circuit 16, and a switching circuit 17.

The control circuit 83 includes a voltage detecting circuit 1, an error amplifier (EA) 6, a phase compensation unit 7, a DAC (Digital-Analog Converter) 48, and a switch control circuit 12.

(Voltage Detecting Circuit) The voltage detecting circuit 1 includes resistive elements 22, 23, a switch 2, an operational amplifier 3, and resistive elements 4, 5.

An output node OP of the switching circuit 17 is coupled to a resistive element 22 and an output node ON of the switching circuit 17 is coupled to a resistive element 23.

A first input terminal A1 of the switch 2 is coupled to the resistive element 22. A second input terminal A2 of the switch 2 is coupled to the resistive element 23.

The first input terminal A1 of the switch 2 is coupled to one of a first output terminal B1 and a second output terminal B2 of the switch 2 and the second input terminal A2 of the switch 2 is coupled to the other one of the first output terminal B1 and the second output terminal B2 of the switch 2.

When a voltage Vop at the output node OP is more than or equal to a voltage Von at the output node ON, a switching signal SW is at "H" level, as will be described later, and the first input terminal A1 of the switch 2 and the second output terminal B2 of the switch 2 are coupled and the second input terminal A2 of the switch 2 and the first output terminal B1 of the switch 2 are coupled. When the voltage Vop at the output node OP is less than the voltage Von at the output node ON, the switching signal SW is at "L" level, as will be described later, and the first input terminal A1 of the switch 2 and the first output terminal B1 of the switch 2 are coupled and the second input terminal A2 of the switch 2 and the second output terminal B2 of the switch 2 are coupled.

An output from the output terminal B1 of the switch 2 is coupled to a negative input terminal of the operational amplifier 3. The negative input terminal of the operational amplifier 3 is coupled via a resistive element 4 to an output terminal of the operational amplifier 3. An output from the second output terminal B2 of the switch 2 is coupled to a positive input terminal of the operational amplifier 3. The positive input terminal of the operational amplifier 3 is coupled via a resistive element 5 to a ground GND.

When a resistance value of the resistive elements 22 and 23 is denoted by R1 and a resistance value of the resistive elements 4 and 5 is denoted by R2, a voltage O1 at the output terminal of the operational amplifier 3 is expressed as: (R2/R1)|Vop−Von|.

(Error Amplifier) The error amplifier (EA) 6 receives the output voltage O1 of the operational amplifier 3 and a control voltage VREF that is output from the DAC 48 and outputs an error voltage ER depending on an error between O1 and VREF.

When the output voltage O1 of the operational amplifier 3 is less than the control voltage VREF, the error amplifier (EA) 6 outputs an "H" level error voltage ER. When the output voltage O1 of the operational amplifier 3 is more than the control voltage VREF, the error amplifier (EA) 6 outputs an "L" level error voltage ER. When the output voltage O1 of the operational amplifier 3 is equal to the control voltage VREF, the error amplifier (EA) 6 outputs an intermediate level error voltage ER between the "L" and "H" levels.

(Phase Compensation Unit) The phase compensation unit 7 includes a resistive element 8 and a capacitive element 9 coupled in series between an output node of the error amplifier (EA) 6 and a ground GND. The phase compensation unit 7 also includes a capacitive element 10 coupled between the output node of the error amplifier (EA) 6 and a ground GND. By the phase compensation unit 7, switching noise elimination and phase compensation are performed.

(Charging Circuit) The charging circuit 11 charges a piezo element 50 by applying a high voltage to the piezo element 50. This charging circuit 11 is a voltage up circuit that outputs a voltage higher than an input voltage Vi that is output from a power supply VIN.

The charging circuit 11 has an N-channel MOS transistor 14, a diode 15, and a coil 13.

One end of the coil 13 is coupled to the power supply VIN. The other end of the coil 13 is coupled to a node N1.

A drain of the N-channel MOS transistor 14 is coupled to the node N1. A source of the N-channel MOS transistor 14 is grounded to a ground GND. A gate of the N-channel MOS transistor 14 is coupled to the switch control circuit 12.

The diode 15 is provided between the node N1 and a node N2. When the N-channel MOS transistor 14 is switched from ON to OFF, after a current flows through the coil 13 during an ON period of the N-channel MOS transistor 14, an induced voltage is generated in the coil 13 by turn-off of the N-channel MOS transistor 14. The induced voltage produced by the coil 13 is added to the voltage at the node N1 and the resultant voltage is supplied via the diode 15 to the node N2.

(Switch Control Circuit) The switch control circuit 12 outputs a pulse signal when the error voltage ER that is output from the error amplifier (EA) 6 is at "H" level. By the pulse signal, the N-channel MOS transistor 14 is switched between ON and OFF.

(Discharging Circuit) The discharging circuit 16 discharges electric charge stored in the piezo element 50.

Figure 2:
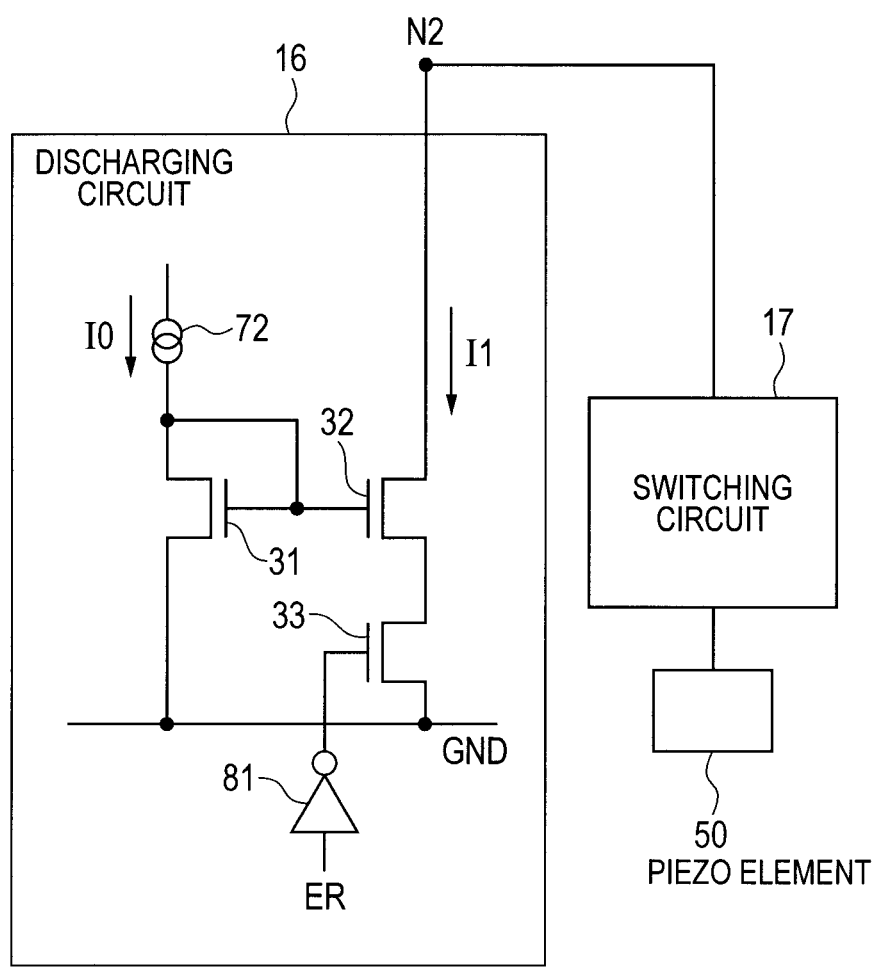
FIG. 2 is a diagram depicting a configuration of a discharging circuit.

FIG. 2 is a diagram depicting a configuration of the discharging circuit. Referring to FIG. 2, this discharging circuit 16 has an inverter 81, a constant current source 72, and N-channel MOS transistors 31 to 33.

The constant current source 72 generates a constant current I0. An N-channel MOS transistor 31 and an N-channel MOS transistor 32 form a current mirror circuit.

By the inverter 81, an N-channel MOS transistor 33 is turned OFF when the error voltage ER at "L" level. When the N-channel MOS transistor 33 is ON, a current I1 which is as large as a current I0 from the node N2 flows through the N-channel MOS transistor 32 and the N-channel MOS transistor 33 to a ground GND. Thereby, the electric charge stored in the piezo element 50 is discharged.

(Switching Circuit) The switching circuit 17 has N-channel MOS transistors 18 to 21 and inverters 73, 74. The N-channel MOS transistors 18 to 21 form an H bridge circuit.

The H bridge circuit is provided between the node N2 that is coupled to the output of the charging circuit I1 and a low potential power supply VIN.

The piezo element 50 is coupled between an output node OP of the H bridge circuit and an output node ON of the H bridge circuit.

A drain of an N-channel MOS transistor 18 is coupled to the node N2, a source thereof is coupled to the output node OP, and a gate thereof receives a switching signal SW.

A drain of an N-channel MOS transistor 20 is coupled to the node N2, a source thereof is coupled to the output node ON, and a gate thereof receives a switching signal SW via an inverter 73.

A drain of an N-channel MOS transistor 19 is coupled to the output node OP, a source thereof is coupled to the power supply VIN, and a gate thereof receives a switching signal SW via the inverter 74.

A drain of an N-channel MOS transistor 21 is coupled to the output node ON, a source thereof is coupled to the power supply VIN, and a gate thereof receives a switching signal SW.

When the switching signal SW is at "H" level, the N-channel MOS transistor 18 and the N-channel MOS transistor 21 are ON and the N-channel MOS transistor 19 and the N-channel MOS transistor 20 are OFF. Thereby, the output node OP is coupled to the high potential node N2 and the output node ON is coupled to the low potential power supply VIN.

When the switching signal SW is at "L" level, the N-channel MOS transistor 18 and the N-channel MOS transistor 21 are OFF and the N-channel MOS transistor 19 and the N-channel MOS transistor 20 are ON. Thereby, the output node OP is coupled to the low potential power supply VIN and the output node ON is coupled to the high potential node N2.

A voltage Vop at the output node OP is applied to one electrode of the piezo element 50 and, meanwhile, it is fed back to the voltage detecting circuit 1. A voltage Von at the output node ON is applied to the other electrode of the piezo element 50 and, meanwhile, it is fed back to the voltage detecting circuit 1. That is, a voltage |Vout|=|Vop−Von| is applied across both electrodes of the piezo element 50. Here, |A| represents an absolute value of A.

Figure 3A:
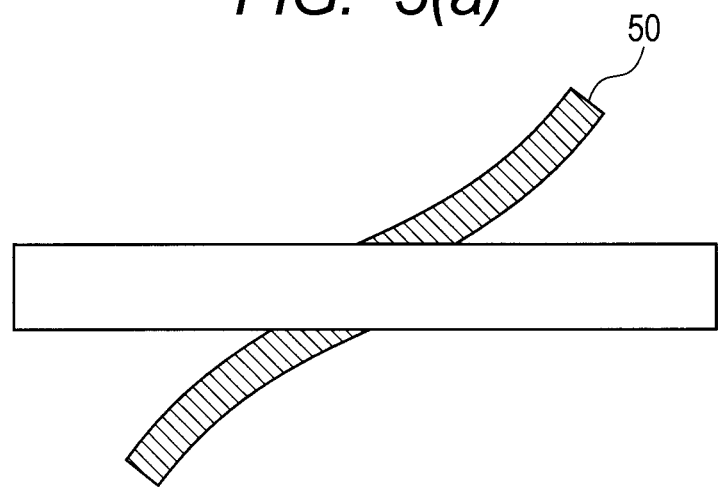
FIG. 3(a) is a diagram depicting a change in the shape of a piezo element when a voltage Vop is larger than a voltage Von.
Figure 3B:
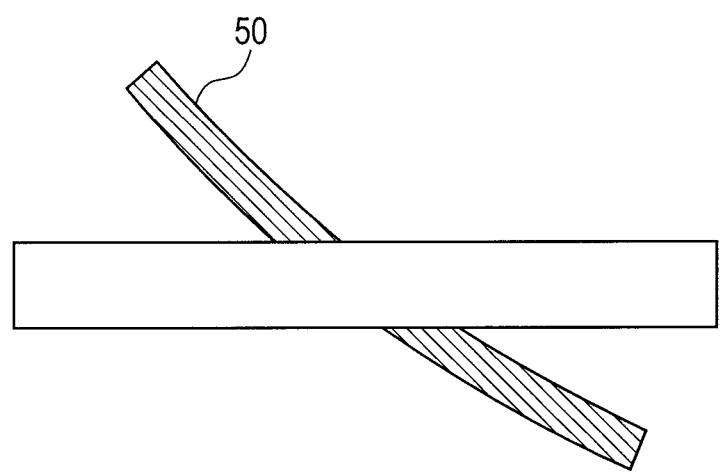
FIG. 3(b) is a diagram depicting a change in the shape of the piezo element when the voltage Vop is smaller than the voltage Von.

(Piezo Element) FIGS. 3(a) and 3(b) are diagrams for explaining a change in the shape of the piezo element.

FIG. 3(a) is a diagram depicting a change in the shape of the piezo element when the voltage Vop is larger than the voltage Von.

The piezo element 50 expands if the absolute value of a difference between the voltage Vop and the voltage Von is larger and the piezo element 50 contracts if the absolute value of a difference between the voltage Vop and the voltage Von is smaller. In this way, the piezo element 50 is displaced.

FIG. 3(b) is a diagram depicting a change in the shape of the piezo element when the voltage Vop is smaller than the voltage Von.

The piezo element 50 expands if the absolute value of a difference between the voltage Vop and the voltage Von is larger and the piezo element 50 contracts if the absolute value of a difference between the voltage Vop and the voltage Von is smaller. In this way, the piezo element 50 is displaced.

Figure 4A:
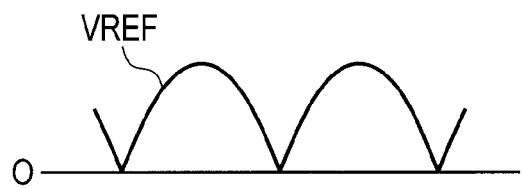
FIG. 4(a) is a diagram representing how a control voltage VREF changes.

(About Voltage Control) The DAC 48 changes the control voltage VREF, as shown in FIG. 4(a).

Figure 4B:
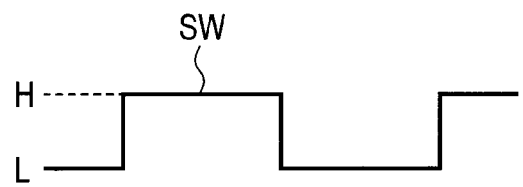
FIG. 4(b) is a diagram representing how a switching signal SW changes.
Figure 4C:
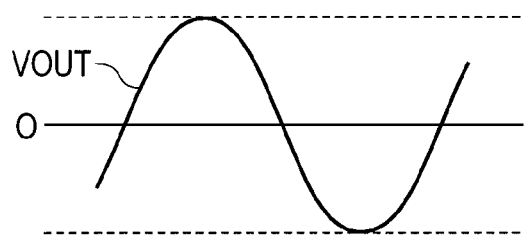
FIG. 4(c) is a diagram representing how an output voltage Vout changes.

The DA 48 changes the switching signal SW, as shown in FIG. 4(b). FIG. 4(c) is a diagram representing how the output voltage Vout changes. This represents Vout in a case of R1=R2.

When the switching signal SW is at "H" level, the first input terminal A1 of the switch 2 and the second output terminal B2 of the switch 2 are coupled and the second input terminal A2 of the switch 2 and the first output terminal B1 of the switch 2 are coupled.

When the switching signal SW is at "H" level, as shown in FIG. 4(b), the N-channel MOS transistor 18 and the N-channel MOS transistor 21 are ON and the N-channel. MOS transistor 19 and the N-channel MOS transistor 20 are OFF. As a result, the voltage Vop becomes more than or equal to the output voltage Von and the output voltage Vout=Vop−Von becomes 0 or positive, as shown in FIG. 4(c). Its magnitude becomes equivalent to the VREF value by charging and discharging of the charging circuit 11 and the discharging circuit 16.

When the switching signal SW is at "L" level, the first input terminal A1 of the switch 2 and the first output terminal B1 of the switch 2 are coupled and the second input terminal A2 of the switch 2 and the second output terminal B2 of the switch 2 are coupled.

When the switching signal SW is at "L" level, as shown in FIG. 4(b), the N-channel MOS transistor 18 and the N-channel MOS transistor 21 are OFF and the N-channel MOS transistor 19 and the N-channel MOS transistor 20 are ON. As a result, the voltage Vop becomes less than the output voltage Von and the output voltage Vout=Vop−Von becomes negative, as shown in FIG. 4(c). Its magnitude becomes equivalent to the control voltage VREF value by charging and discharging of the charging circuit 11 and the discharging circuit 16.

Figure 4D:
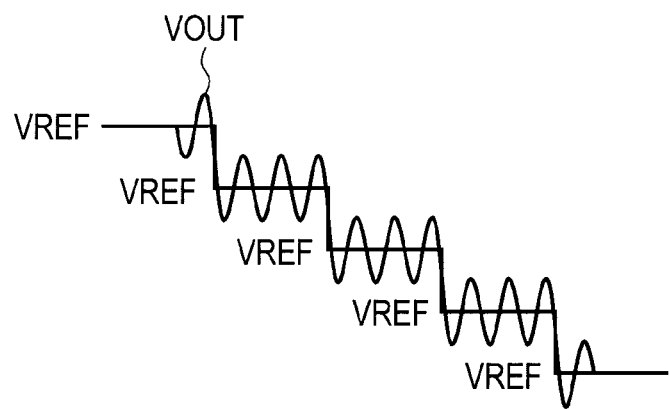
FIG. 4(d) is a detailed representation of the graph shown in FIG. 4(c).

FIG. 4(d) is a detailed representation of the graph shown in FIG. 4(c). As shown in FIG. 4(d), from a micro perspective, a control voltage VREF is given for each step. Charging and discharging are repeated by feedback control so that the magnitude of the output voltage Vout corresponds to the given control voltage VREF.

Figure 5:
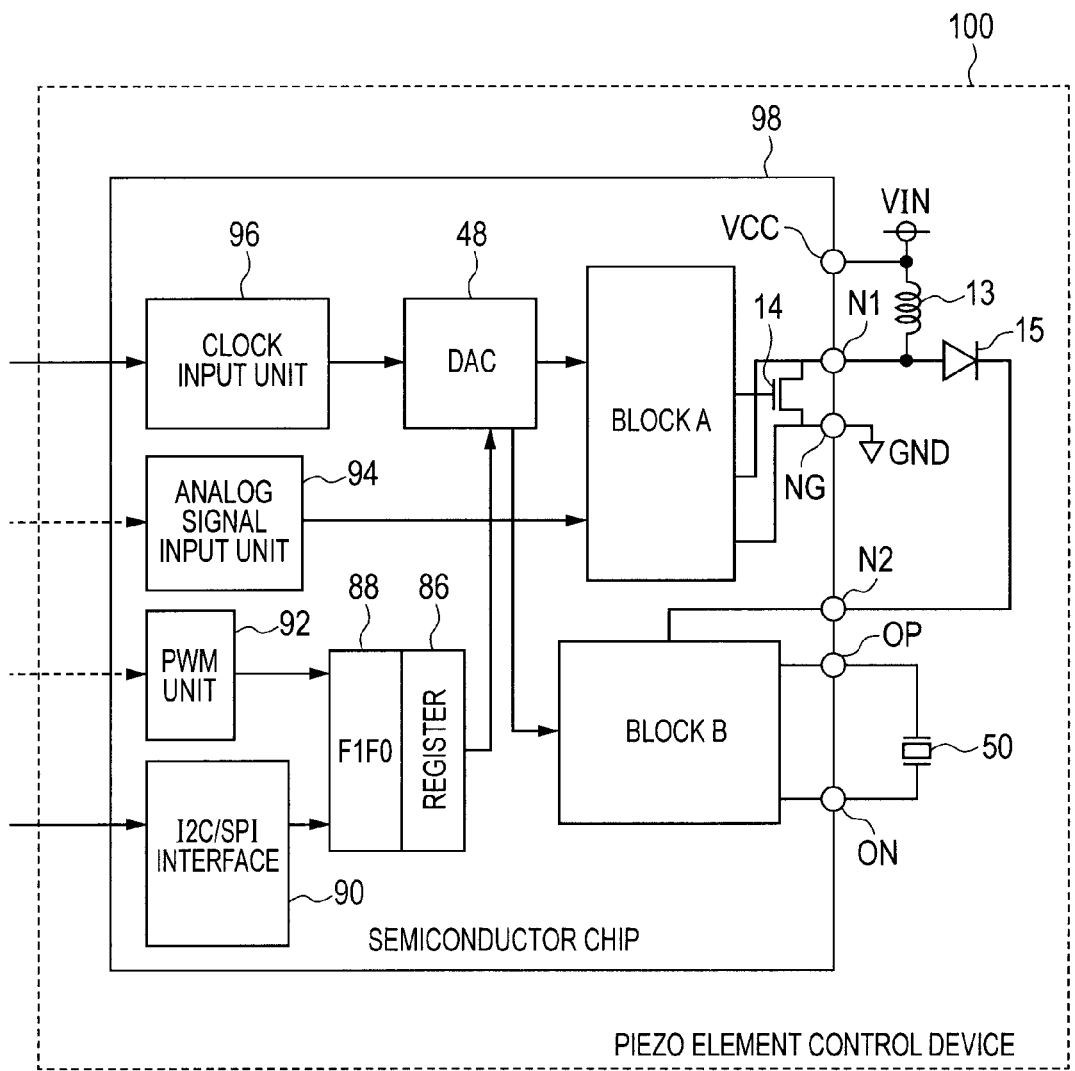
FIG. 5 is a diagram depicting a piezo element control device in which the piezo element driving device and the piezo element shown in FIG. 1 are included.

(Piezo Element Control Device) FIG. 5 is a diagram depicting a piezo element control device in which the piezo element driving device and the piezo element shown in FIG. 1 are included.

As shown in FIG. 5, the piezo element control device 100 includes a semiconductor chip 98. The semiconductor chip 98 includes, a clock input unit 96 to which a clock is input, an analog signal input unit 94 to which an analog signal is input, a PWM (Pulse Width Modulation) unit 92, an I2C/SPI interface (Inter-Integrated Circuit/Serial Peripheral Interface) 90 for serial communication with an external device, a DAC 48, a FIFO (First In First Out) 88 for buffering signals from outside, a register 86, a block A, a block B, and the N-channel MOS transistor 14 which is a component of the charging circuit 11. In the block A, the control circuit 83 is located. In the block B, the discharging circuit 16 and the switching circuit 17 are located.

The DAC 48 outputs a control voltage VREF and a switching signal SW according to instructions written into the register 86 by a CPU or a logic unit which is not shown.

The piezo element control device 100 has the coil 13 and the diode 15 which are components of the charging circuit 11 outside the semiconductor chip 98. The diode 15 is coupled via the node N2 to the discharging circuit 16 inside the block B. The switching circuit 17 inside the block B is coupled via the node OP and the node ON to the piezo element 50.

As above, according to the present embodiment, the control circuit causes the discharging circuit to perform a discharging action, when the magnitude of the voltage Vout applied to the piezo element, multiplied by a constant (R2/R1), is larger than the magnitude of the control voltage VREF. Whereas, the control circuit causes the charging circuit to perform a charging action, when the magnitude of the control voltage VREF is larger than the magnitude of the voltage Vout applied to the piezo element, multiplied by the constant. Thus, it is possible to make the output voltage follow the control voltage during a discharging action.

Second Embodiment

Figure 6:
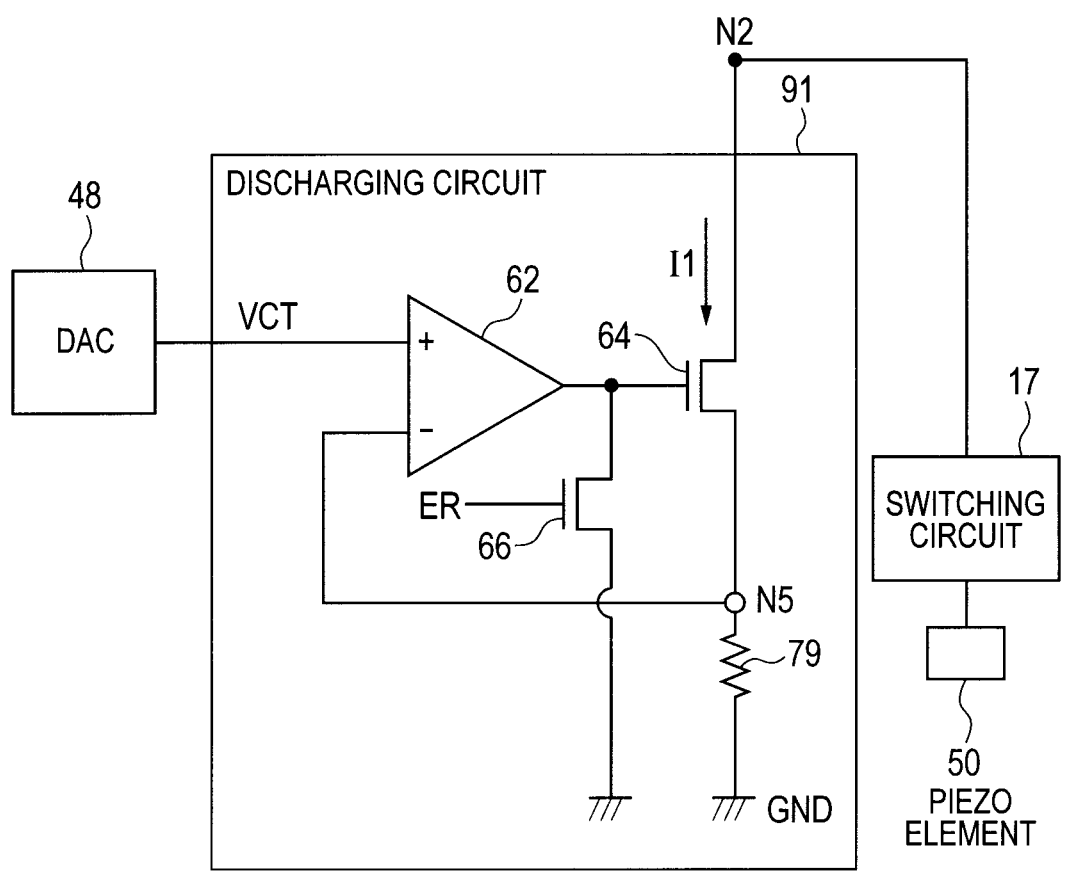
FIG. 6 is a diagram depicting a configuration of a discharging circuit of a second embodiment.

FIG. 6 is a diagram depicting a configuration of a discharging circuit of a second embodiment. The discharging circuit shown in this embodiment can replace the discharging circuit 16.

Referring to FIG. 6, this discharging circuit 91 includes a current output amplifier 62, an N-channel MOS transistor 64, an N-channel MOS transistor 66, and a resistive element 79.

The N-channel MOS transistor 64 is located between a node N2 and a node N5. The resistive element 79 is located between the node N5 and a ground GND.

A positive input terminal of the current output amplifier is coupled to the DAC 48 and a negative input terminal thereof is coupled to the node N5. The output of the current output amplifier 62 is coupled to a gate of th N-channel MOS transistor 64.

The DAC 48 controls the magnitude of a control voltage VCT to the current output amplifier 62. The current output amplifier 62 outputs a current whose magnitude is proportional to the magnitude of the control voltage VCT that is output from the DAC 48.

When the error voltage ER is at "L" level, the N-channel MOS transistor 66 is OFF. When the error voltage ER is at "H" level, the N-channel MOS transistor 66 is ON.

When the N-channel MOS transistor 66 is ON, the output current of the current output amplifier 62 flows through the N-channel MOS transistor 66 to the ground GND. Therefore, when the error voltage ER is at "H" level, no electric charge stored in the piezo element 50 is discharged.

When the N-channel MOS transistor 66 is OFF, a current I1 proportional to the magnitude of the output of the current output amplifier 62 flows from the node N2 through the N-channel MOS transistor 64 and the resistive element 79 to the ground GND. Therefore, when the error voltage ER is at "L" level, electric charge stored in the piezo element 50 is discharged.

Figure 7:
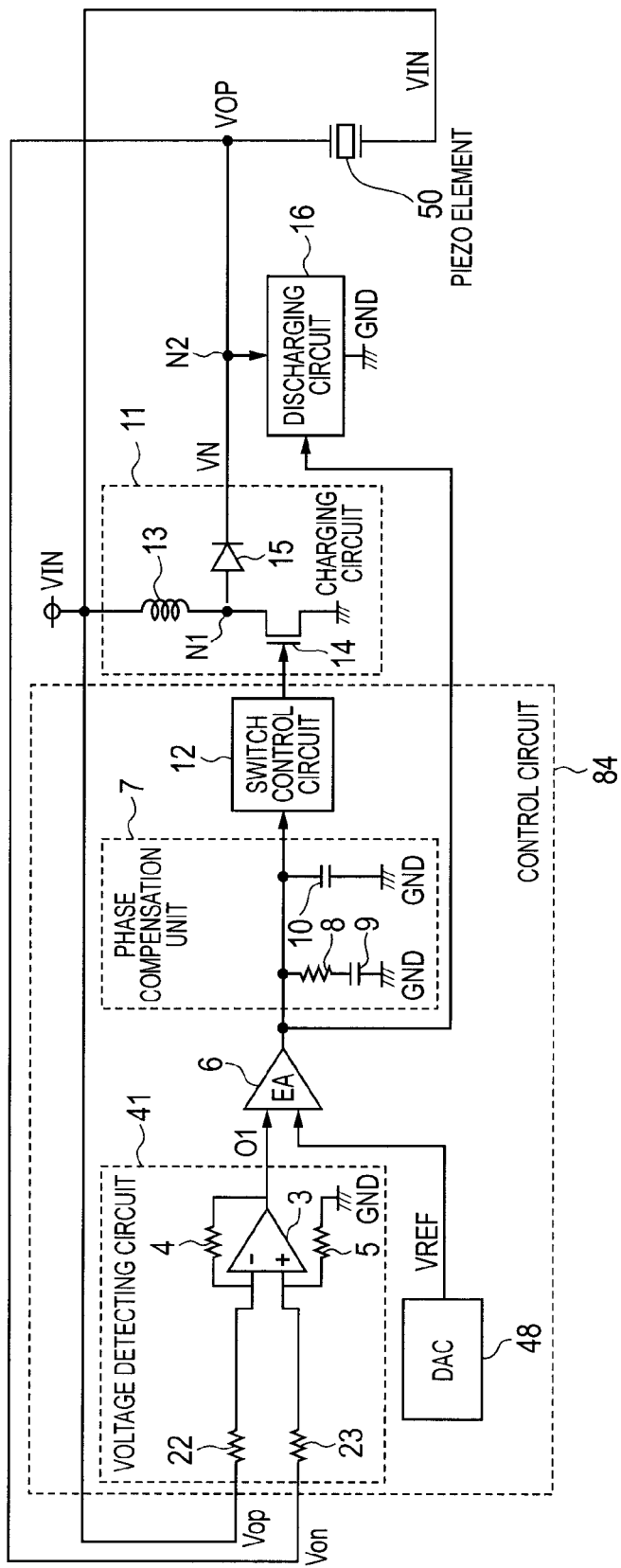
FIG. 7 is a diagram depicting a configuration of a piezo element driving device of a third embodiment.

As above, according to the present embodiment, by the use of the current output amplifier in the discharging circuit, it is possible to control the amount of discharging per unit time Third Embodiment FIG. 7 is a diagram depicting a configuration of a piezo element driving device of a third embodiment that includes a voltage detecting circuit 41 and a control circuit 84.

The piezo element driving device in FIG. 7 differs from the piezo element driving device in FIG. 1 in the points that the switching circuit 17 is not provided and the switch 2 is not provided.

More specifically, in the piezo element driving device in FIG. 7, the high potential node N2 is coupled to one electrode of the piezo element 50 and the low potential power supply VIN is coupled to the other electrode of piezo element 50.

The high potential node N2 is also coupled via the resistive element 23 to a positive input terminal of the operational amplifier 3. The low potential power supply VIN is also coupled via the resistive element 22 to a negative input terminal of the operational amplifier 3.

As above, according to the present embodiment, it is possible to use the piezo element driving device that dispenses with the switching circuit in a case where the piezo element is made to undergo a deflection only in one direction.

Fourth Embodiment

Figure 8:
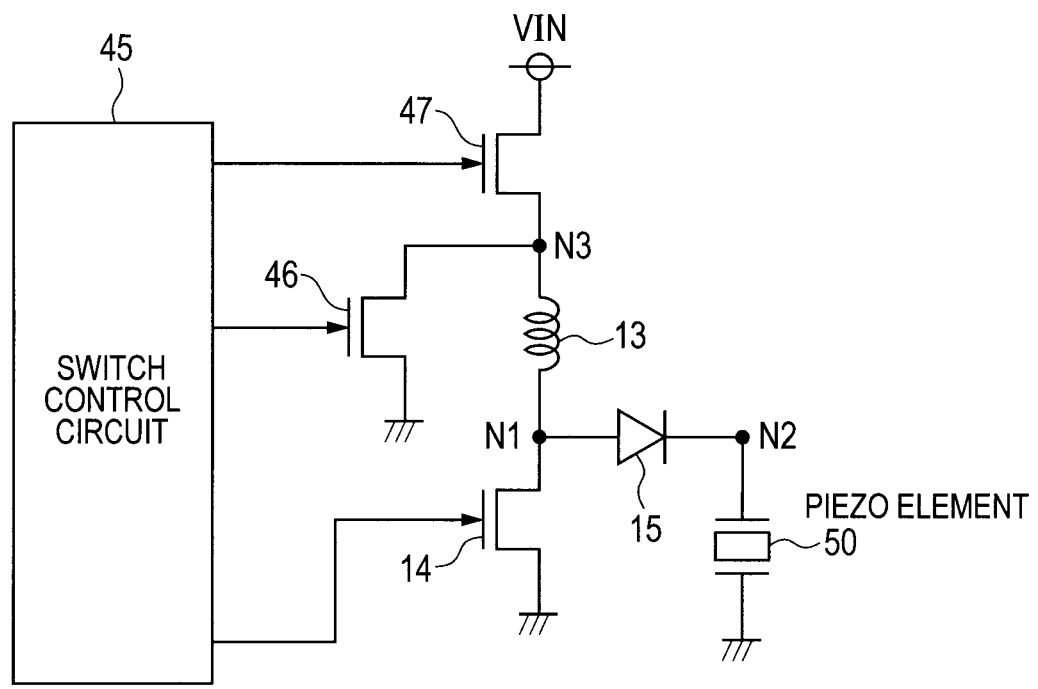
FIG. 8 is a diagram depicting a configuration of a charging circuit and a switch control circuit of a fourth embodiment.

FIG. 8 is a diagram depicting a configuration of a charging circuit and a switch control circuit of a fourth embodiment. The charging circuit shown in this embodiment can replace the charging circuit 11.

This charging circuit charges the piezo element 50 by applying a high voltage to the piezo element 50. This charging circuit is a cross converter (voltage up/down converter) that outputs a voltage more than or equal to an input voltage that is output from the power supply VIN in a voltage up mode, whereas outputs a voltage less than the input voltage that is output from the power supply VIN in a voltage down mode.

This charging circuit has the N-channel MOS transistor 14, diode 15, and coil 13, as is the case for the first embodiment.

A node N3 is coupled to one end of the coil 13. A node N1 is coupled to the other end of the coil 13.

A drain of the N-channel MOS transistor 14 is coupled to the node N1. A source of the N-channel MOS transistor 14 is grounded to a ground GND. A gate of the N-channel MOS transistor 14 receives a signal from the switch control circuit 45.

The diode 15 is provided between the node N1 and a node N2. This charging circuit further includes an N-channel MOS transistor 46 and an N-channel MOS transistor 47.

A drain of the N-channel MOS transistor 46 is coupled to the node N3. A source of the N-channel MOS transistor 46 is grounded to a ground GND. A gate of the N-channel MOS transistor 46 receives a signal from the switch control circuit 45.

A drain of the N-channel MOS transistor 47 is coupled to the power supply VIN. A source of the N-channel MOS transistor 47 is coupled to the node N3. A gate of the N-channel MOS transistor 47 receives a signal from the switch control circuit 45.

Figure 9A:
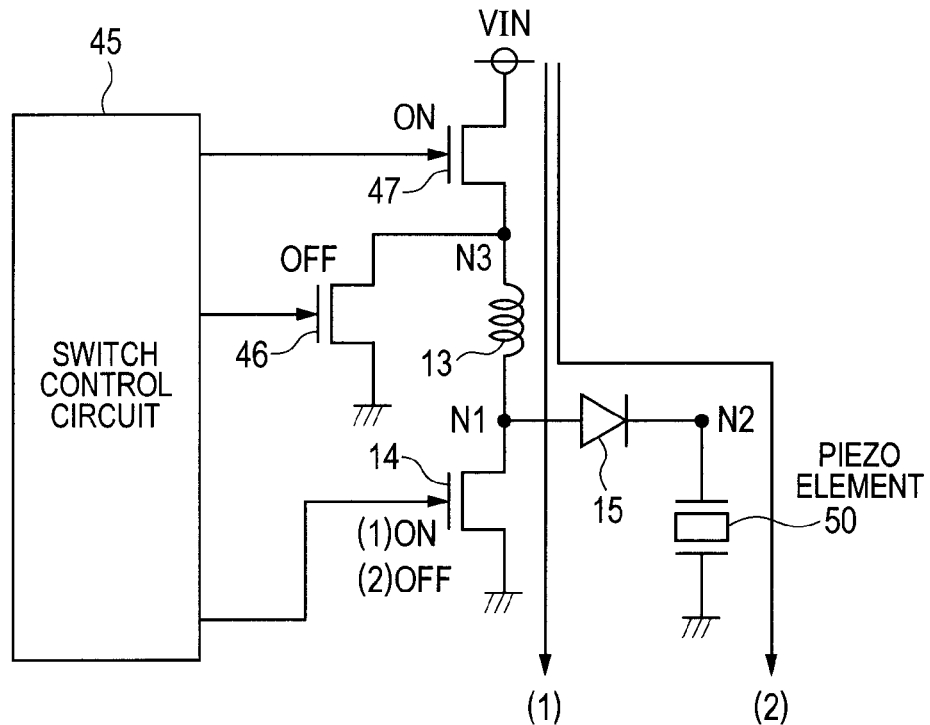
FIG. 9(a) is a diagram for explaining operation in a voltage up mode.

(Voltage Up Mode) FIG. 9(a) is a diagram for explaining operation in a voltage up mode.

The switch control circuit 45 turns the N-channel MOS transistor 46 OFF by turning the signal "L" to the N-channel MOS transistor 46.

The switch control circuit 45 turns the N-channel MOS transistor 47 ON by turning the signal "H" to the N-channel MOS transistor 47.

The switch control circuit 45 outputs a pulse signal to the N-channel MOS transistor 14, when the error voltage ER that is output from the error amplifier (EA) 6 is at "H" level. By the pulse signal, the N-channel MOS transistor 14 is switched between ON and OFF.

When the N-channel MOS transistor 14 is ON, a current flows through a path indicated as (1) in FIG. 9(a). When the N-channel MOS transistor 14 is OFF, a current flows through a path indicated as (2) in FIG. 9(a).

By switching from ON to OFF of the N-channel MOS transistor 14, an induced voltage is generated in the coil 13, as described for the first embodiment. The resulting increased voltage is output via the diode 15 to the node N2.

Figure 9B:
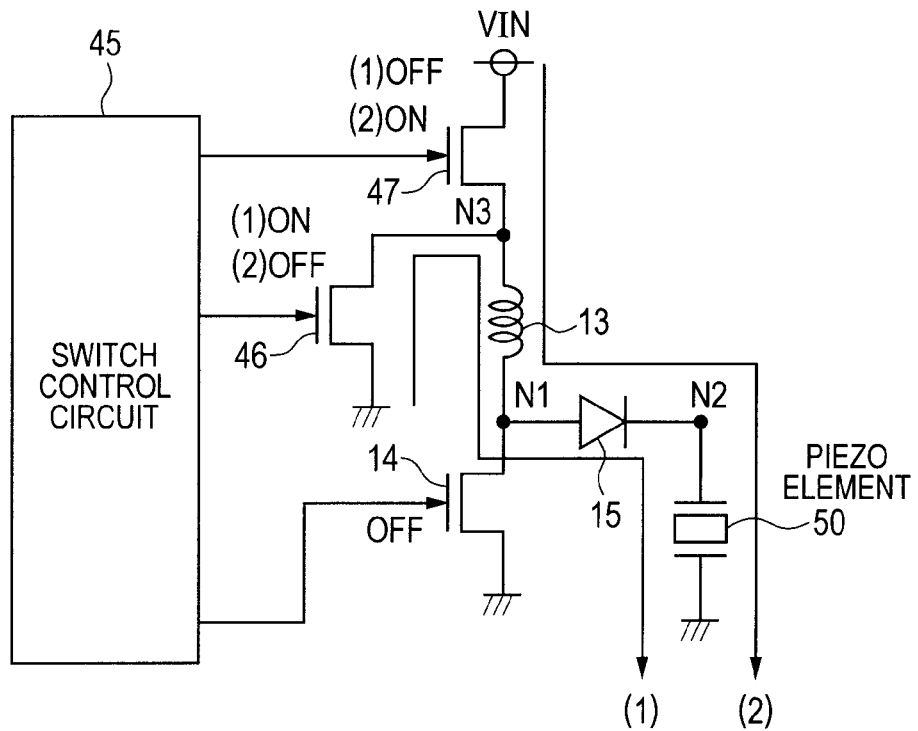
FIG. 9(b) is a diagram for explaining operation in a voltage down mode.

(Voltage Down Mode) FIG. 9(b) is a diagram for explaining operation in a voltage down mode.

The switch control circuit 45 turns the N-channel MOS transistor 46 OFF by turning the signal "L" to the N-channel MOS transistor 14.

The switch control circuit 45 outputs a first pulse signal to the N-channel MOS transistor 47, when the error voltage ER that is output from the error amplifier (EA) 6 is at "H" level. By the first pulse signal, the N-channel MOS transistor 47 is switched between ON and OFF.

The switch control circuit 45 outputs a second pulse signal to the N-channel MOS transistor 46, when the error voltage ER that is output from the error amplifier (EA) 6 is at "H" level. By the second pulse signal, the N-channel MOS transistor 46 is switched between ON and OFF.

When the first pulse signal is at "H" level, the second pulse signal is at "L" level; when the first pulse signal is at "L" level, the second pulse signal is at "H" level.

When the N-channel MOS transistor 47 is OFF and the N-channel MOS transistor 46 is ON, a current flows through a path indicated as (1) in FIG. 9(b). When the N-channel MOS transistor 47 is ON and the N-channel MOS transistor 46 is OFF, a current flows through a path indicated as (2) in FIG. 9(b).

By switching from ON to OFF of the N-channel MOS transistor 46 and the N-channel MOS transistor 47, an induced voltage is generated in the coil 13, as described for the first embodiment. The resulting increased voltage is output via the diode 15 to the node N2. Moreover, by the current flowing through the path (2), it is possible to output a voltage lower than the voltage of the power supply VIN (that is, to decrease the voltage of the power supply VIN).

Figure 10:
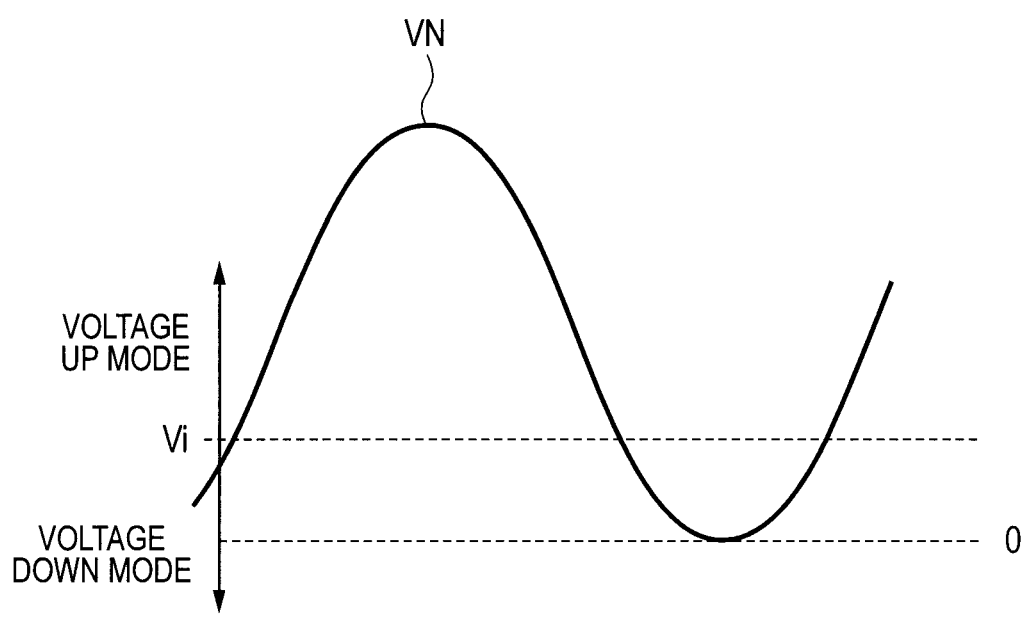
FIG. 10 is a diagram representing how a voltage VN at a node N2 changes in the fourth embodiment.

FIG. 10 is a diagram representing how a voltage VN at the node N2 changes in the fourth embodiment. In the voltage up mode, the voltage VN at the node N2 is more than or equal to the voltage Vi of the power supply VIN. In the voltage down mode, the voltage VN at the node N2 is smaller than the voltage Vi of the power supply VIN and can be decreased down to the ground GND level.

As above, according to the present embodiment, it is possible to apply a voltage decreased lower than the power supply voltage to one electrode of the piezo element.

Fifth Embodiment

Figure 11:
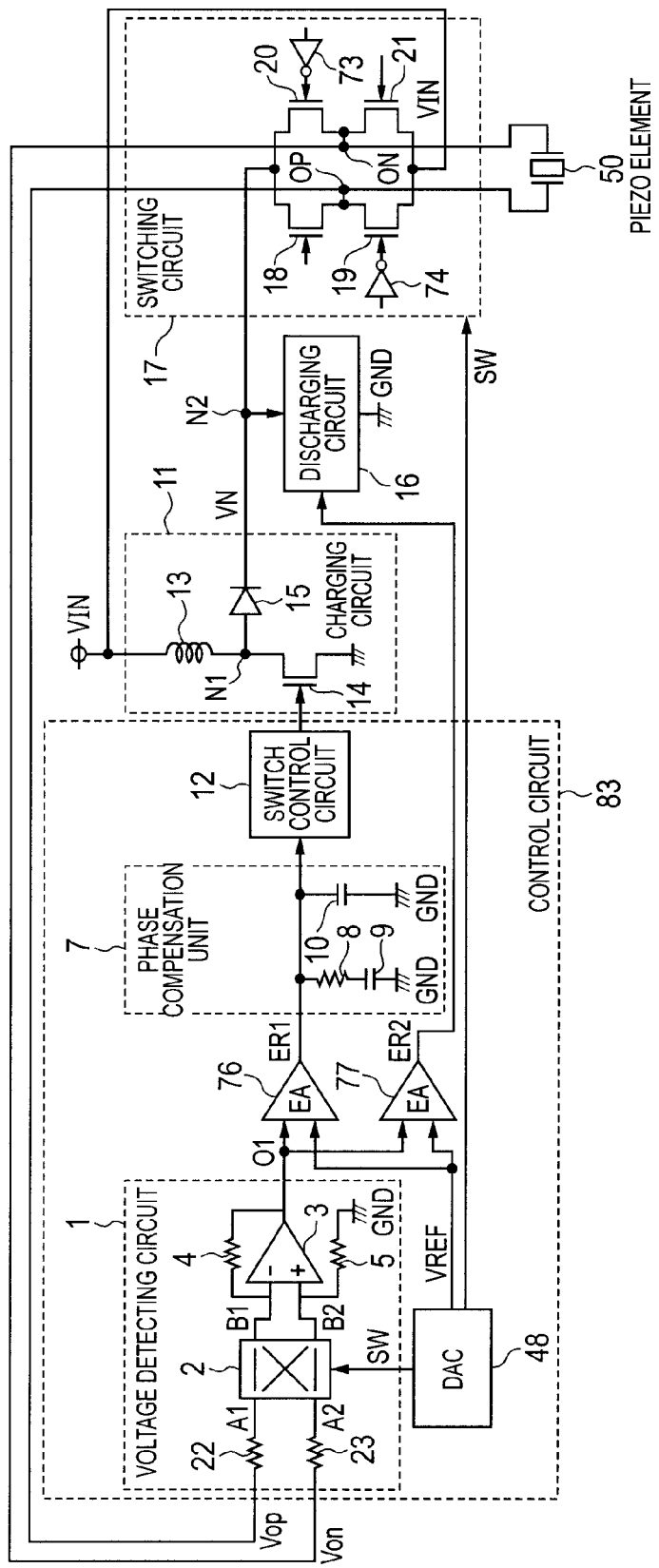
FIG. 11 is a diagram depicting a configuration of a piezo element driving device of a fifth embodiment.

FIG. 11 is a diagram depicting a configuration of a piezo element driving device of a fifth embodiment.

This piezo element driving device differs from the piezo element driving device in FIG. 1 in the point that a first error amplifier 76 and a second error amplifier 77 are provided instead of the error amplifier 6.

(Error Amplifiers) The output of the first error amplifier 76 is coupled to the switch control circuit 12. The output of the second error amplifier 77 is coupled to the discharging circuit 16.

The first error amplifier (EA) 76 receives the output voltage O1 of the operational amplifier 3 and the control voltage VREF from the DAC 48, amplifiers a difference between O1 and VREF, and outputs an error voltage ER1.

The first error amplifier (EA) 76 outputs an error voltage ER1 of "H" level, when the output voltage O1 of the operational amplifier 3 is less than the control voltage VREF. The first error amplifier (EA) 76 outputs an error voltage ER1 of "L" level, when the output voltage O1 of the operational amplifier 3 is more than or equal to the control voltage VREF.

The second error amplifier (EA) 77 receives the output voltage O1 of the operational amplifier 3 and the control voltage VREF from the DAC 48, amplifiers a difference between O1 and VREF, and outputs an error voltage ER2.

The second error amplifier (EA) 77 outputs an error voltage ER2 of "H" level, when the control voltage VREF is less than the output voltage O1 of the operational amplifier 3. The second error amplifier (EA) 77 outputs an error voltage ER2 of "L" level, when the control voltage VREF is more than or equal to the output voltage O1 of the operational amplifier 3.

(Switch Control Circuit) The switch control circuit 12 outputs a pulse signal when the error voltage ER1 that is output from the first error amplifier (EA) 76 is at "H" level. By the pulse signal, the N-channel MOS transistor 14 is switched between ON and OFF. By switching between ON and OFF of the N-channel MOS transistor 14, an induced voltage is generated in the coil 13. This induced voltage is output via the diode 15 to the node N2.

Figure 12:
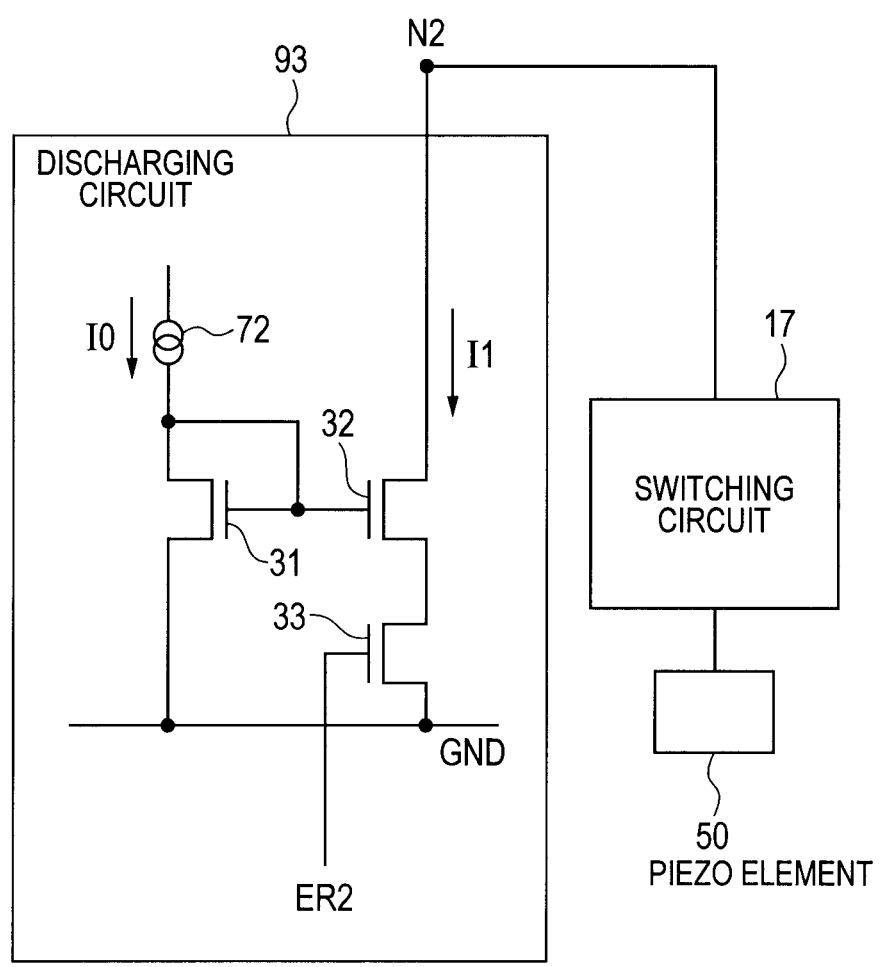
FIG. 12 is a diagram depicting a configuration of a discharging circuit of the fifth embodiment.

(Discharging Circuit) FIG. 12 is a diagram depicting a configuration of a discharging circuit of the fifth embodiment. The discharging circuit shown in this embodiment can replace the discharging circuit 16.

Referring to FIG. 12, this discharging circuit 93 differs from the discharging circuit 16 of the first embodiment in FIG. 2 in the point that the discharging circuit 93 does not include the inverter 81.

When the error voltage ER2 that is output from the second error amplifier 77 is at "H" level, the N-channel MOS transistor 33 is ON. When the N-channel MOS transistor 33 is ON, a current I1 which is as large as a current I0 from the node N2 flows through the N-channel MOS transistor 32 and the N-channel MOS transistor 33 to a ground GND. Thereby, the electric charge stored in the piezo element 50 is discharged.

As above, according to the present embodiment, by using two error amplifiers that output two levels "H" and "L" of voltages, it is possible to carry out charging and discharging actions, as is the case for the first embodiment.

(Modification Example) The piezo element driving device described in the embodiments of the present invention can also be used to drive a liquid lens.

The embodiments disclosed herein should be considered in all respects as illustrative and not restrictive. The scope of the present invention is indicated by the appended claims, rather than by the foregoing description, and all changes which come within the meaning and range of equivalency of the claims are intended to be embraced therein.

What is claimed is:

1. A device for driving a piezoelectric element, comprising:
    a charging circuit that charges the piezoelectric element through a first node;
    a discharging circuit that discharges electric charge charged in the piezoelectric element through the first node; and
    a control circuit that controls switching to cause the discharging circuit to perform a discharging action or cause the charging circuit to perform a charging action, based on a comparison between the magnitude of a voltage being applied to the piezoelectric element and the magnitude of a control voltage,
    wherein the discharging circuit includes:
        a current output amplifier;
        a first switch that is provided between the first node and a ground and controlled by the output of the current output amplifier; and
        a second switch that is provided between the output of the current output amplifier and a ground, and
    wherein the control circuit controls an input voltage to the current output amplifier and controls ON/OFF of the second switch.

2. The device for driving a piezoelectric element according to claim 1, further comprising an H bridge circuit provided between the first node and a low potential power supply,
    wherein the piezoelectric element is coupled between a first output node of the H bridge circuit and a second output node of the H bridge circuit.

3. The device for driving a piezoelectric element according to claim 2,
    wherein the control circuit includes a voltage detecting circuit that detects an output voltage corresponding to a difference between a voltage at the first output node of the H bridge circuit and a voltage at the second output node of the H bridge circuit.

4. The device for driving a piezoelectric element according to claim 3,
    wherein the control circuit includes an error amplifier that outputs a voltage depending on an error between the output voltage detected by the voltage detecting circuit and the control voltage.

5. The device for driving a piezoelectric element according to claim 1, wherein the charging circuit is a voltage up circuit that outputs a voltage more than or equal to an input voltage.

6. The device for driving a piezoelectric element according to claim 1, wherein the charging circuit is a voltage up/down converter that outputs a voltage more than or equal to an input voltage in a voltage up mode and outputs a voltage less than the input voltage in a voltage down mode.

* * * * *